United States Patent [19]

Kosonocky

[11] 4,375,597

[45] Mar. 1, 1983

[54] METHOD OF IMPLEMENTING UNIFORM BACKGROUND CHARGE SUBTRACTION IN A RADIATION SENSING ARRAY

[75] Inventor: Walter F. Kosonocky, Skillman, N.J.

[73] Assignee: The United States of America as represented by the Secretary of the Air Force, Washington, D.C.

[21] Appl. No.: 191,044

[22] Filed: Sep. 25, 1980

[51] Int. Cl.³ .................. H03K 3/42; H01L 29/78; H01L 27/14; H01L 31/00
[52] U.S. Cl. ............................. 307/311; 357/15; 357/30; 357/24; 377/63
[58] Field of Search ...................... 357/24 LR, 30; 307/221 D, 311

[56] References Cited

U.S. PATENT DOCUMENTS

| | | | |
|---|---|---|---|
| 3,986,198 | 4/1975 | Kosonocky | 357/24 R |
| 4,040,076 | 8/1977 | Kosonocky et al. | 357/24 LR |
| 4,162,411 | 7/1979 | Sakaue et al. | 357/24 R |
| 4,328,432 | 5/1982 | Yamazaki | 357/24 LR |

Primary Examiner—Gene M. Munson
Attorney, Agent, or Firm—Donald J. Singer; Willard R. Matthews, Jr.

[57] ABSTRACT

Uniform background charge subtraction in a radiation sensing array is realized by removing the background charge from the array detectors several times during each array integration time. Radiation sensing arrays of the type to which the method of the invention can be applied include a radiation sensor with a charge storage reservoir to which there is coupled a CCD output register having a channel with multiple charge storage sites. Signal background and bias charge is accumulated in the charge storage reservoir and transferred to a CCD storage site by a transfer gate. Charge in the CCD storage site can be shifted to another storage site in the CCD channel or it can be dispersed to drain by means of a drain barrier gate. According to the method of the invention a number of times during each array integration period the charge accumulated in the charge storage reservoir is transferred to a CCD charge storage site and then returned in part to the reservoir leaving a metered amount in the charge storage site. This is then dispersed to drain. After a set number of repetitions the signal charge is skimmed from the total charge remaining in the charge storage reservoir and transferred to the CCD charge storage site. The signal charge is then shifted along the CCD channel to another storage site clearing the device for another cycle of operation.

7 Claims, 4 Drawing Figures

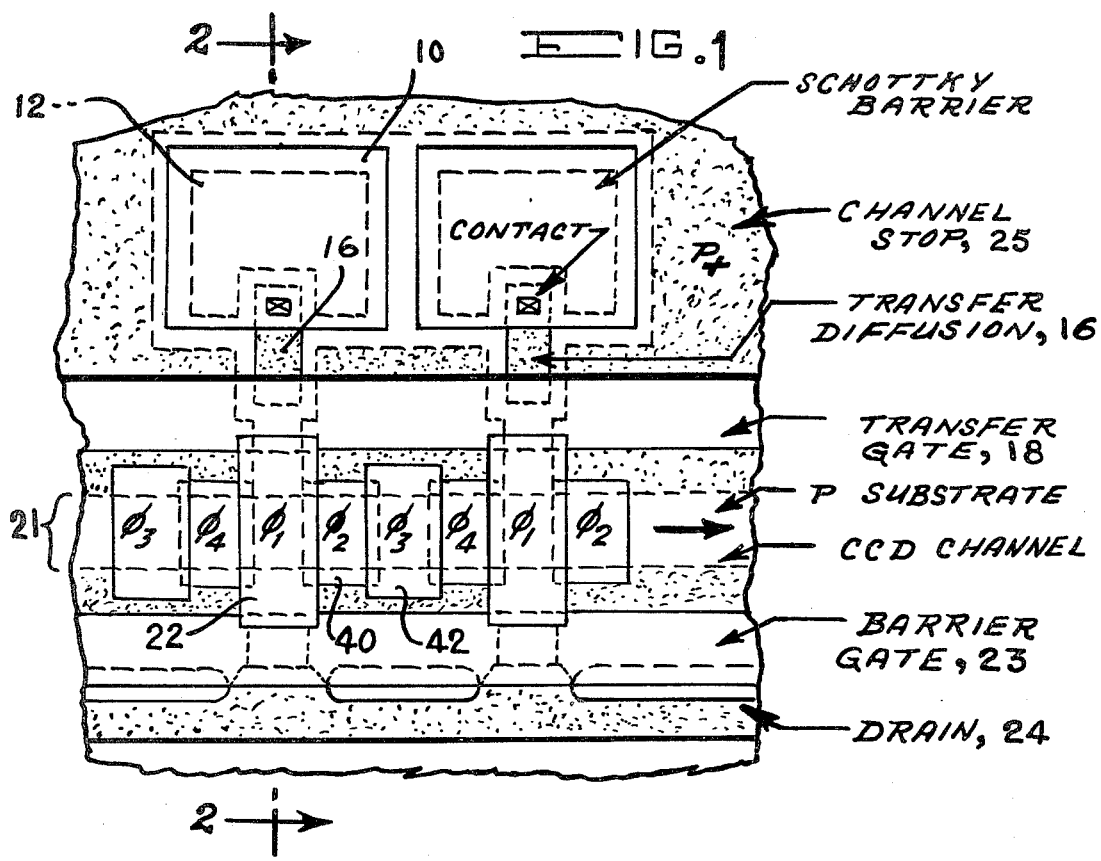
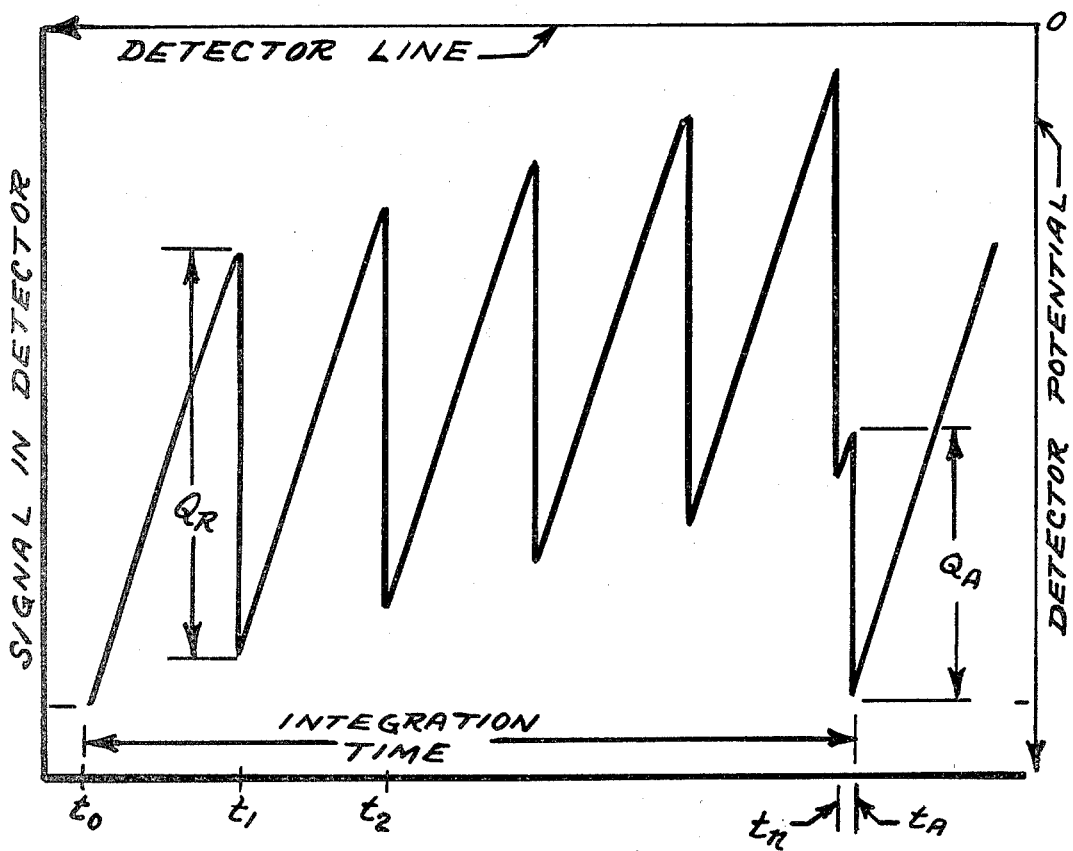

METHOD OF IMPLEMENTING UNIFORM BACKGROUND CHARGE SUBTRACTION IN A RADIATION SENSING ARRAY

STATEMENT OF GOVERNMENT INTEREST

The invention described herein may be manufactured and used by or for the Government for governmental purposes without the payment of any royalty thereon.

BACKGROUND OF THE INVENTION

The invention relates to charge transfer circuits such as those employed in "skimming" a charge signal. It particularly relates to a method for achieving uniform background charge subtraction in such circuits.

U.S. Pat. No. 3,845,295 to W. F. Kosonocky (one of the present inventors) and B. F. Williams for "Charge Coupled Radiation Sensing Circuit with Charge Skim-Off and Reset" issued Oct. 29, 1974, describes a charge skimming circuit and discusses also where such circuits are useful. In the patented circuit, a photodiode or other radiation sensor accumulates charge when a radiation image is projected thereon. After a suitable integration time, that portion of the charge which is greater than a given level is passed through the conduction path of one field effect transistor (FET) to a stage of a CCD register. Then, the remainder of the charge signal is passed through the conduction path of a second FET transistor to a drain, resetting the radiation sensor in the process. If, as is often the case, the threshold voltage of the FET's varies from one location to another, there will be non-uniformities introduced into the skimming process. For example, if the threshold voltage for the various reset transistors is not the same, the radiation sensors in the array will not be reset to the same reference voltage level. Similarly, if the transistors employed to skim the charge signals do not have the same threshold voltage, the point at which the skimming starts will not be the same from one radiation sensor to another. Also, if the threshold level of a reset transistor for a location differs from that of the skimming transistor of heat location, the difference between threshold levels will be introduced into the skimmed signal as a charge increment (or as a charge deficit). In all of these cases, the differences in skimming and reset levels are manifested as fixed pattern noise in the reproduced image.

U.S. Pat. No. 4,040,076 to W. F. Kosonocky and E. S. Kohn for "Charge Transfer Skimming and Reset Circuit" issued Aug. 2, 1977 discloses a circuit of the same general type discussed above in which non-uniformities due to different threshold voltages are essentially eliminated. In the circuit described in this patent the portion which exceeds a given level, of a charge signal present at a radiation sensor, is passed to a storage site via the conduction path beneath a gate electrode. The remainder of the charge signal is removed to a drain through the same conduction path, the radiation sensor being reset to a reference level in the process. The use of a common conduction path for setting both the charge signal "skimming" level and the reset level, improves the uniformity of the skimming process from one sensor to another. Although this circuit largely solves the problems enumerated above it can be limited in its application. That is, in operation, the circuit allows the removal of a fixed amount of charge from the charge detected by each sensor element only once for each frame time or integration time. If, however, the total detected charge during one integration should be considerably larger than the capacity of the detector well the system would saturate and fail. This is complicated by the fact that the fabrication of radiation sensor/CCD register whose detector capacity is much larger than the register well capacity can be difficult to achieve. Consequently, in order for background removal to be used advantageously when these two capacities are comparable it is necessary to remove charge from the detectors several times during the integration period.

The present invention comprehends a method of operation that is applicable to circuits of the type described that meets this multiple charge removal per integration period requirement.

SUMMARY OF THE INVENTION

The invention is directed to charge transfer circuits and in particular to a method for implementing uniform background subtraction in such circuits using fill-and-spill techniques. According to one specific example of the invention a Schottky barrier photosensor having a charge reservoir coupled to a CCD register having a channel with multiple charge storage sites is used in which a transfer gate is pulsed from a first level to a level causing a CCD channel potential well (change storage site) to fill with the charge from the Schottky device reservoir. The transfer gate is then returned to the first level while the potential well is being reduced in capacity thereby allowing some charge to spill back through the transfer channel leaving only a metered charge in the potential well. A drain-barrier gate set at a high level during the fill-and-spill procedure is then depleted permitting the metered charge to spill into drain diffusion. Alternately, the metered charge can be shifted through the CCD channel. After a set number of repetitions the charge remaining in the Schottky barrier device reservoir is skimmed into the potential well and then removed to another charge storage site in the CCD channel to allow for the next cycle of operation.

It is a principal object of the invention to provide a new and improved method for operating charge transfer circuits.

It is another object of the invention to provide a method for implementing uniform background charge subtraction in radiation sensing circuits.

It is another specific object of the invention to provide a method for implementing uniform background charge subtraction in infrared CCD image sensors.

These together with other objects, features and advantages of the invention will become more readily apparent from the following detailed description when taken in conjunction with the illustrative embodiment of the accompanying drawings.

DESCRIPTION OF THE DRAWINGS

FIG. 1 is a plan view of a portion of an infrared imager of the type to which the method of the invention can be applied;

FIG. 4 is a graph of signal charge in the detector of FIGS. 1 and 2 versus time for one integration period of the sensor array.

DETAILED DESCRIPTION OF THE PREFERRED EMBODIMENT

Figure 2:
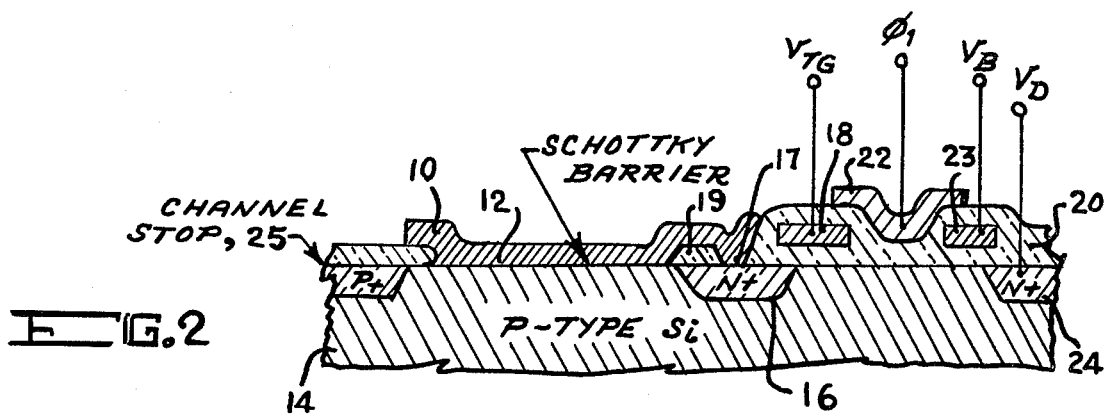
FIG. 2 is a section view of the imager of FIG. 1 taken along line 2—2.

Radiation sensing arrays of the type to which the method of the invention can be applied are typified by the thermal imager of the accompanying drawings. Referring thereto the imager illustrated in FIGS. 1 and 2 is of the Schottky barrier type and is especially suitable for the detection of infrared radiation. Each location can be considered to include a Schottky barrier device and a stage of the CCD register. The former includes a metal electrode 10 such as one formed of aluminum. At the interface 12 of the metal electrode and the semiconductor substrate 14 there is a Schottky barrier formed of a material such as platinum silicide, palladium silicide or the like. The substrate 14 may be a P type silicon substrate.

The remainder of the structure at each location includes an N type diffusion 16 which serves as a means for transferring the charge accumulated at the Schottky barrier device to the remainder of the structure. This diffusion is in ohmic contact with the aluminum at 17 and is overlapped at one edge by a transfer gate electrode 18. Region 19 is an insulating layer formed of silicon dioxide. Electrodes 18, 22 and 23 may be formed of polysilicon or a metal and are insulated from the substrate by insulating layer 20 which may be formed of silicon dioxide. The transfer gate electrode 18 couples the various Schottky barriers to a charge-coupled device (CCD) output register 21. One of the electrodes 22 of the register is illustrated in the cross-section view. The following electrode 23 is a barrier gate electrode and its purpose is to control the flow of background charge to drain diffusion 24. The latter is formed of N type material. Channel stops 25, comprising regions of the substrate of the same conductivity type as the substrate but of higher impurity concentration than the substrate, serve to confine the flow of charge to desired paths.

During an integration time, the radiation reaching the Schottky barrier excites carriers in the metal or silicide. Those of the excited carriers with sufficient momentum in the direction of the Schottky barrier can cross the barrier and become majority carriers in the silicon substrate (holes in the example illustrated), thus discharging the detector. There remains in the metal or silicide free electrons corresponding to the holes which have passed into the substrate, and these free electrons are the charge signals which later may be read out via the transfer diffusion 16 which is in ohmic contact with the metal electrode 10.

In practicing the method of the invention charge is removed from the Schottky barrier device several times during each array integration time. This is shown graphically in FIG. 4. A fixed quantity of charge $Q_R$ is removed from each detector N times. Shortly after the Nth removal (at $t_A$) the detector is skimmed back to its original potential, and the signal charge $Q_A$ is loaded into the charge-coupled shift register to be read out. The skimming level is shown as level W2 in FIG. 3(a). This scheme is useful when the scene has low contrast (as is true of thermal scenes) and has sufficient illumination to overfill the detectors many times during the desired integration time. The fixed charge to be removed, $Q_R$, is set to be slightly smaller than the background signal accumulated between removals, so that the remaining detector charge is always growing, and is mostly signal charge.

Figure 3:
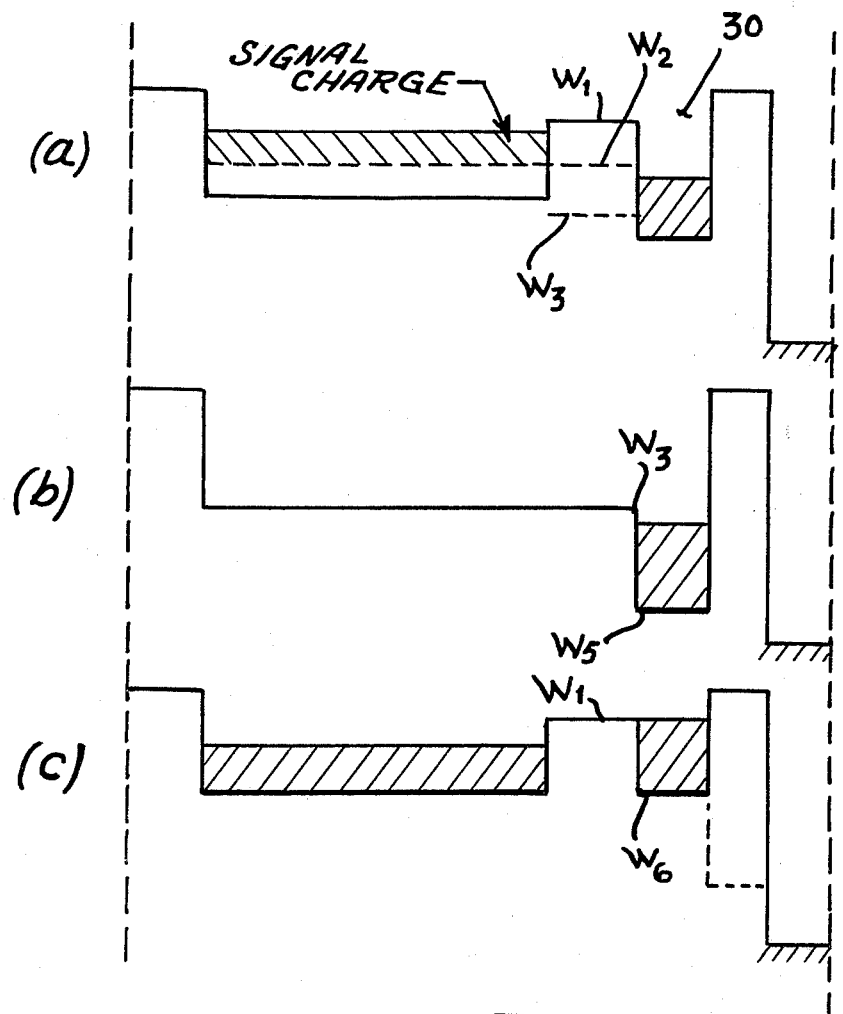
FIG. 3 is a drawing of surface potential profiles to help explain the operation of the image of FIGS. 1 and 2.

The removal of fixed quantities of charge is accomplished by the charge-preset or fill-and-spill method. FIG. 3 shows how this is accomplished with the well 30 under a shift-register gate (phase-1) used as the metering well, and the transfer gate (electrode 18) used to set the spill level. The transfer-gate and the phase-1 gate are pulsed hard to levels W3 and W5 in FIG. 3(b), loading the phase-1 well with charge as shown. The potential under the transfer gate is returned to level W1 (which is still moderate depletion) and then the well depth under the phase-1 gate is changed to level W6 as in FIG. 3(c). Charge spills back through the transfer channel into the detector until the Charge $Q_R$ $(=\Delta\phi \times C_{well})$ remains. The drain-barrier-gate (electrode 23), which had been a high barrier during all of this, is now pulsed into deep depletion permitting the metered charge $Q_R$ to spill into the drain diffusion. This event takes place several times during the integration time as shown in FIG. 4. If the skimmed signal charge is being read out of the shift register during the integration time, the signal charge packets must be protected in phase-3 wells during each removal operation. It should be noted that his charge-preset method of background-removal involves two gates, the transfer gate and a CCD gate, and will therefore be sensitive to their respective MOS thresholds.

The method of the invention has been described using an auxiliary drain-diffusion. The method can also be used without such a drain if the CCD can be read out in a time much smaller than the desired integration time. The metered charges $Q_R$ can be clocked out of the shift-register (and ignored by the output circuit) several times for each time the skimmed signal charge is read out. Although the signal charge is read out during only part of the time between frames, the integration time is the entire time between frames.

In accordance with the foregoing description it is seen that the method of the invention dictates that there be removed from the Schottky barrier potential well, during one integration time, successive fixed amounts of charge and that these fixed amounts of charge be dumped to the drain diffusion. After a given number of charge removal periods (five in the example of FIG. 4) and following the fill and spill cycle to be discussed, there will be in the Schottky barrier well the remaining signal charge component plus some bias charge, and rather than being dumped, the signal charge will be skimmed from the bias charge and transferred to a well in the CCD channel, and subsequently propagated down the register of that channel.

In more detail, assume for purposes of illustration that as shown in FIG. 4 fixed amounts of charge are removed from the Schottky barrier potential well five times. Assume also that the signal-plus-background noise charge accumulated during one integration period is 53 arbitrary charge units and that the fixed amount of charge removed during each of the first five charge removal times is ten units of charge (a total of 50 charge units removed). This situation is realistic in infrared imaging as the charge induced in each Schottky barrier potential well consists mainly of background charge with a small amount of signal charge superimposed. FIG. 3b depicts the transfer of the entire well of charge which consists of a small bias charge plus a small signal charge, plus a large background charge. This transfer can be considered the "fill" part of a "fill and spill" cycle. This entire charge is shown in a well in the CCD channel in FIG. 3b after being transferred in response to the application of an appropriate voltage to the transfer gate which produced beneath the transfer gate the surface potential W3.

Thereafter, the potential of the gate in the CCD channel is raised to cause a portion of this charge to "spill" from the CCD channel back into the Schottky barrier potential well. This portion of the charge includes a bias charge and signal charge. There remains in the CCD channel the ten units of charge just referred to. These ten units of charge have been removed from the Schottky barrier well. Shortly thereafter, the drain barrier gate potential is changed to remove the barrier beneath that gate and permit the charge in the CCD channel to transfer to the drain where it is dissipated.

The procedure described above occurs during the first charge removal interval of an integration time. Integration continues and the Schottky barrier again accumulates charge and again the procedure is repeated to drain off ten more units of charge. This process continues until five charge removals have occurred. At this time (after the fifth spill) there will be present in the Schottky barrier well, signal plus some bias charge. Integration now continues for time $t_n - t_a$ (FIG. 4) and then the transfer gate is adjusted to produce the barrier W2 (see FIG. 3a). This causes the skimming of an amount $Q_A$ of signal charge from the bias charge. This signal charge (three units in this example) is not transferred to the drain but rather it is stored and it represents the small amount of signal which was superimposed on the background charge most of which was removed in the previous five cycles. This signal charge subsequently is propagated down the CCD register to the output (not illustrated). The CCD register is shown more clearly in FIG. 1 and it consists of the multiple phase electrodes 22, 40, 42 and so on.

To summarize what has occurred, during one integration time a total of 53 units of charge have accumulated. These 53 units consists of 50 units of background charge and 3 units of signal charge. The Schottky barrier potential well is not big enough to store this amount of charge. After a relatively small fixed interval of the integration time, ten units of charge are removed from the Schottky barrier well and the remainder is returned thereto. This process is repeated five times. The amount of charge returned each time will be slightly more than returned during the preceding skimming interval and this is depicted in FIG. 3 by the successively higher points at which the sawtooth-like curves start. Note at time $t_0$ there is zero signal charge in the Schottky barrier but note that this zero point starts above the graph time axis to indicate that there is a bias (background) charge present. At time $t_1$ there is a small amount of charge (bias+signal) which has been returned to the Schottky barrier well during the spill operation. At time $t_2$ the amount of charge returned is greater as the signal component has increased. After the fifth skimming interval (time $t_n$), upon the completion of the spill operation, there is in the Schottky barrier well as bias charge plus a reasonably large level of signal charge (somewhat less than $Q_A$). A short time later ($t_a$) the signal charge has increased to $Q_A$ and it is removed from the potential well and propagated down the CCD channel. In this example the signal charge is three units. After the completion of the transfer of the various signal charge packets from the CCD register, a new integration period can begin.

By way of further explanation there is hereinafter presented a comparison of the device and mode of operation of U.S. Pat. No. 4,040,076 described above and herein incorporated by reference with the method of the present invention.

Basically the subject matter of each invention deals with a circuit and a method for removing a fixed amount of background charge from a detected signal by a thermal imager. This approach allows the transfer to the CCD register only the net signal charge that represents a very small fraction of the total detected signal. For example, in thermal imaging, the general background corresponds to an average temperature of 300K while the useful signal $\Delta T$ may correspond to only several degrees. Thus, by eliminating (i.e., dumping into a drain) a major portion of the fixed background charge, the CCD register can be designed with much smaller charge handling capacity.

In the approach taken in U.S. Pat. No. 4,040,076 the net signal (or the part of the detected charge that can vary from frame to frame or from detector to detector) is skimmed-off first into a CCD register. This is accomplished in a similar manner as if one would remove the total detected charge signal, except the potential under the transfer gate is controlled to remove only a small amount of charge. (At this step, some of the detected charge is removed from the detector).

The next step in operation of the device of the referenced patent is to move the skimmed-off signal charge to the half stage of the CCD register not directly connected to the detector where it will be stored during the next step consisting of dumping of a fixed-large amount of charge (the background charge) illustrated in FIGS. 3a and 3b of the patent. Now, while the skimmed net signal charge (plus some background) is stored under the $\phi$-3 gate, the $\Phi3$ and $\Phi4$ gates form barriers between which this charge is stored—and the $\Phi$-1 gate is available for transferring the "background charge" (in other words a large-fixed amount of the detected charge) from the detector to the drain—as is shown in FIG. 3c of the patent.

The operation of this circuit as described in the U.S. Pat. No. 4,040,076, allows the removal of a fixed amount of charge from the charge detected by each sensor element—only once for each frame time or integration time. If, however, the total detected charge during one integration should be considerably larger than the capacity of the detector well, the above system would saturate and fail.

The present invention on the other hand comprehends a method of operation that permits removal from the detector array of n fixed amounts of charge, where n is some arbitrary number, during an integration time. As is the case of the patent discussed above, in the present invention the detector array represents a portion of either a line sensor or a vertical column register in a two dimensional so-called interline transfer area sensor. As described in the patent, the removal (dumping) of a fixed amount of charge is accomplished only once per integration time after the signal is skimmed off and stored in the CCD register (under $\Phi$-3 gate). According to the operation of the present invention described above, the dumping of a fixed amount of charge can be accomplished after each transfer cycle of after some number of transfer cycles of the CCD register. The only requirement for proper operation is that previously skimmed-off effective signal charge packets be stored (as in Part A) under the $\Phi$-3 gates. Referring again to FIG. 3a of the patent the fixed amount of detected charge that is to be dumped in this case is the charge $Q_B$, that can be approximated by $$Q_B = C_{detector}(\phi_3 - \phi_2)$$

where $\phi_1$ and $\phi_3$ are the potentials under the transfer gate and $C_{detector}$ is the effective capacitance of the detector. In other words, the fixed charge to be dumped corresponds to filling the detector well between potentials W2 and W3. This operation can be done only once, since setting of the detector to W2 potential requires that some charge be removed (skimmed off). This skimming of charge removes the useful signal since the amount of charge skimmed cannot be fixed. In the case of the present invention the measuring of the fixed amount of charge is done by a filled CCD well (FIG. 3c) which is formed under the Φ-gate of the CCD register and is filled to the potential W1 under the transfer gate. The difference of potential $\Delta\phi$ represent the difference between the $\phi_1$ potential W1 and the potential W6 under Φ-1 gate in the absence of the charge in the CCD well. The fixed amount of charge, that is removed by the procedure of the invention described above, can be repeated a number of times since the measuring of charge in this case is done outside of the detector. Of course, it also could be done only once. Unlike the case of the patent, in the case of the present invention the sequence of when the fixed charge is removed from the detector in reference to when the signal is skimmed off is not important. All that is required is that when the signal is read from the detector there is performed a skimming operation and when the fixed charge is subtracted the amount of this fixed charge is measured by the so-called fill-and-spill method illustrated in FIG. 3.

For example, the present method can be used for the detector array such as shown in FIG. 1 operating in the so-called TDI (time-delayed-integration) mode. In this case once per TDI cycle each detector can be skimmed to remove the accumulated signal variation and also in the other half cycle a fixed amount of charge may be subtracted from each detector and dumped to the drain. The important concept in the case of the present invention is that while a charge is being periodically transferred from stage to stage of a CCD register once every transfer cycle of the CCD register a fixed amount of charge can be substracted from the detectors via the same transfer gates that are used in skimming of the charge signal. Thus, there is provided a method for subtracting an arbitrary amount of fixed charge from the detected signal without introducing a fixed pattern noise, i.e. local signal variations between detectors.

This invention has been described in terms of infrared imaging and Schottky barrier detectors. The light, however, need not be infrared, but can be visible, or in any part of the spectrum having low contrast images which can be very bright. The detectors need not be Schottky barriers but an be p-n junctions, on or off the chip, or any detector that can be connected to a transfer diffusion. A photo-gate detector is a complete transfer device and can be used that way with the present invention. Therefore, while the invention has been described in one presently preferred embodiment, it is understood that the words which have been used are words of description rather than words of limitation and that changes within the purview of the appended claims may be made without departing from the scope and spirit of the invention in its broader aspects.

What is claimed is:

1. The method of implementing uniform background charge subtraction in a radiation sensing array, said array being comprised of a substrate, a radiation sensor integral to said substrate and having a charge storage reservoir therein, a register means adjacent thereto integral to said substrate having a channel with multiple charge storage sites including a first charge storage site well in adjacent proximity to and in charge exchange relationship with said charge storage reservoir through a transfer gate disposed therebetween, and a drain integral to said substrate and in proximate juxtaposition to said channel, charge from said first charge storage site well being transferrable to said drain by means of a drain barrier gate electrode disposed therebetween, said method including, for each sensor array integration period, (1) a first operation comprised of the execution of n repetitions, n being an integer, of a sequence of steps comprising:
 (a) accumulating signal, background and bias charge in said charge storage reservoir,
 (b) transferring said accumulated charge into said first charge storage site well,
 (c) transferring a portion of said transferred accumulated charge back into said charge storage reservoir while retaining a preset amount of charge in said first charge storage site well, and
 (d) transferring said retained preset amount of charge from said first charge storage site well to said drain, and (2) subsequent to the nth repetition a second operation comprised of
 (a) skimming signal charge from said charge storage reservoir into said first charge storage site well, and
 (b) transferring said signal charge from said first charge storage site well to another charge storage site in said register means.

2. The method of implementing uniform background charge subtraction in a radiation sensing array as defined in claim 1 wherein n is an integer greater than 1.

3. The method of implementing uniform background charge subtraction in a radiation sensing array as defined in claim 2 wherein said preset amount of charge is substantially equal to $(1/n)[TC-(S+B)]$ where TC is total charge accumulated during an integration period, S is signal charge and B is bias charge.

4. The method of implementing uniform background charge subtraction in a radiation sensing array as defined in claim 3 wherein step 1 (a) comprises applying voltage at a first given level to said transfer gate effective to retain accumulated charge in said charge storage reservoir, step 1 (b) comprises applying voltage at a second given level to said transfer gate adapted to effect transfer of all charge in said charge storage to said first charge storage site well, and applying voltage at a third given level to said first charge storage site to increase the capacitance of the potential well thereof sufficiently to accommodate the total charge transferred from said charge storage reservoir, step 1 (c) comprises applying voltage at said first given level to said transfer gate and applying voltage at a fourth given level to said first charge storage site to effect a decrease in the capacity of the potential well thereof to a capacity that equals said preset amount of charge, and step 1 (d) comprises applying voltage to said drain barrier gate at a given level that effects transfer of charge in said first charge storage site well to said drain and subsequently changing said applied voltage back to its original level.

5. The method of implementing uniform background charge subtraction in a radiation sensing array as defined in claim 4 wherein
   step 2 (a) comprises applying voltage to said transfer gate at a given level that effects transfer of charge above a preset skimming level from said charge storage reservoir to said first charge storage site well.

6. The method of implementing uniform background charge subtraction in a radiation sensing array as defined in claim 1 wherein step 1 (d) comprises transferring said retained preset amount of charge from said first charge storage site through said register channel.

7. The method of implementing uniform background charge subtraction in an infrared imaging array comprised of a substrate, a Schottky barrier sensor integral to said substrate and having a charge storage reservoir, a CCD output register means integral to said substrate, said CCD output register means being coupled to said Schottky barrier sensor and having a channel with multiple charge storage sites including a first charge storage site well adjacent to and in charge exchange relationship with said charge storage reservoir through a transfer gate disposed therebetween, and a drain integral to said substrate and in proximate juxtaposition to said CCD output register means, charge from said first charge storage site well being transferred to said drain by means of a drain barrier gate electrode disposed therebetween, said method including, for each array integration period,
   (1) a first operation comprised of the execution of n repetitions, n being an integer, of a sequence of steps comprising
      (a) accumulating signal, background and bias charge in said charge storage reservoir,
      (b) transferring said accumulated charge into said first charge storage site well,
      (c) transferring a portion of said transferred accumulated charge back into said charge storage reservoir while retaining a preset amount of charge in said first charge storage site well, and
      (d) transferring said retained preset amount of charge from said first charge storage site well to said drain, and
   (2) subsequent to the nth repetition a second operation comprised of
      (a) skimming signal charge from said charge storage reservoir into said first charge storage site well, and
      (b) transferring said signal charge from said first charge storage site well to another charge storage site in said register means.

* * * * *